United States Patent
Schmidt

(10) Patent No.: US 12,020,970 B2
(45) Date of Patent: Jun. 25, 2024

(54) METROLOGY DATA CORRECTION

(71) Applicant: International Business Machines Corporation, Armonk, NY (US)

(72) Inventor: Daniel Schmidt, Niskayuna, NY (US)

(73) Assignee: International Business Machines Corporation, Armonk, NY (US)

(*) Notice: Subject to any disclaimer, the term of this patent is extended or adjusted under 35 U.S.C. 154(b) by 533 days.

(21) Appl. No.: 17/481,582

(22) Filed: Sep. 22, 2021

(65) Prior Publication Data
US 2023/0101448 A1   Mar. 30, 2023

(51) Int. Cl.
*G06F 16/583* (2019.01)
*G03F 7/00* (2006.01)
*H01L 21/68* (2006.01)

(52) U.S. Cl.
CPC .......... *H01L 21/682* (2013.01); *G03F 7/705* (2013.01); *G03F 7/70633* (2013.01); *G06F 16/583* (2019.01)

(58) Field of Classification Search
CPC ... H01L 21/682; G03F 7/705; G03F 7/70633; G06F 16/583
See application file for complete search history.

(56) References Cited

U.S. PATENT DOCUMENTS

| | | | |
|---|---|---|---|
| 7,663,753 B2 | 2/2010 | Mieher et al. | |
| 9,329,033 B2 | 5/2016 | Amit et al. | |
| 9,620,426 B2 | 4/2017 | Izikson et al. | |
| 10,401,738 B2 | 9/2019 | Hill et al. | |
| 2019/0129316 A1* | 5/2019 | Zhou | G03F 7/70633 |
| 2019/0171115 A1* | 6/2019 | Venselaar | G06F 17/12 |

OTHER PUBLICATIONS

Chen et al., "Improved measurement acuracy in optical scatterometry using correction-based library research," Applied Optics, vol. 52, No. 27, Sep. 20, 2013, pp. 6726-6734.
Gao et al., "Process drift compensation by tunable wavelength homing in scatterometry-based overlay," Proceedings of SPIE, vol. 10959, 2019, pp. 1-7.

(Continued)

*Primary Examiner* — Stacy Whitmore
(74) *Attorney, Agent, or Firm* — CANTOR COLBURN LLP; Samuel Waldbaum

(57) ABSTRACT

A computer-implemented method of using a control module to control a lithographic apparatus includes pre-calculating, using a processor, a library of pupil images for a measuring spot of an object-under-test, wherein each pupil image represents a simulated structure of the object-under-test at the measuring spot given a particular set of configuration values and a particular probing wavelength used for testing the object-under-test using scatterometry. The method further includes, in response to receiving a real-time pupil image when testing the object-under-test using scatterometry, comparing, using the processor, the real-time pupil image with the library of pupil images to identify a best match from the library. The method further includes outputting a set of configuration values associated with the best match from the library.

20 Claims, 5 Drawing Sheets

(56) References Cited

OTHER PUBLICATIONS

Jayez et al., "Yield Impact For Wafer Shape Misregistration-Based Binning For Overlay APC Diagnostic Enhancement," Semiconductor Engineering, Semiconductor Engineering, Aug. 5, 2019, 8 pages.
Katz et al., "Accuracy enhancement in imaging-based overlay metrology by optimizing measurement conditions per layer," Metrology, Inspection, and Process Control for Semiconductor Manufacturing XXXV, vol. 11611, Feb. 22, 2021, pp. 1-10.
Littau et al., "Diffraction signature analysis methods for improving scatterometry precision," Proceedings of SPIE, vol. 6152, Mar. 24, 2006, pp. 1-10.
Lozenko et al., "Matching between simulations and measurements as a key driver for reliable overlay target design," Proceedings of SPIE, vol. 10585, 2018, pp. 1-12.
Shi et al., "Multiobjective optimization for target design in diffraction-based overlay metrology," Applied Optics, vol. 59, No. 9, Mar. 20, 2020, pp. 2897-2905.
Zhou et al., "Reducing the overlay metrology sensitivity to perturbations of the measurement stack," Proceedings of SPIE, vol. 10145, 2017, pp. 1-12.

\* cited by examiner

METROLOGY DATA CORRECTION

BACKGROUND

The present invention relates in general to semiconductor manufacture, and more particularly, to systems and methods for obtaining process information and correcting metrology data in the manufacture of semiconductor devices by lithographic techniques using a lithographic apparatus. More particularly, it relates to determining overlay based on diffraction of radiation interacting with such structures.

Semiconductor device manufacturing involves depositing multiple layers of patterned materials on a substrate. All of these multiple patterned layers must be aligned correctly in order for any of the devices to operate properly. Any variations in alignment are generally referred to as overlay errors, which can be measured using metrology in order to determine whether two layers on a substrate are aligned or not. Minimizing overlay errors is important for achieving high yield and reliability, and for ensuring that devices meet performance specifications. Any devices outside the tolerances for overlay will need to be reworked, which is costly and time consuming.

SUMMARY

According to one or more embodiments of the present invention, a computer-implemented method of using a control module to control a lithographic apparatus includes pre-calculating, using a processor, a library of pupil images for a measuring spot of an object-under-test, wherein each pupil image represents a simulated structure of the object-under-test at the measuring spot given a particular set of configuration values and a particular probing wavelength used for testing the object-under-test using scatterometry. The method further includes, in response to receiving a real-time pupil image when testing the object-under-test using scatterometry, comparing, using the processor, the real-time pupil image with the library of pupil images to identify a best match from the library. The method further includes outputting a set of configuration values associated with the best match from the library.

According to one or more embodiments of the present invention, a computer program product comprising a machine-readable medium that has computer executable instructions stored thereon, the computer executable instructions when executed by one or more processing units cause the one or more processing units to perform a method. The method includes pre-calculating a library of pupil images for a measuring spot of an object-under-test, wherein each pupil image represents a simulated structure of the object-under-test at the measuring spot given a particular set of configuration values and a particular probing wavelength used for testing the object-under-test using scatterometry. The method further includes in response to receiving a real-time pupil image when testing the object-under-test using scatterometry, comparing the real-time pupil image with the library of pupil images to identify a best match from the library. The method further includes outputting a set of configuration values associated with the best match from the library.

According to one or more embodiments of the present invention, a system for enhanced overlay control includes an energy unit, and a controller coupled with the energy unit. The controller configured to test an object-under-test by performing a method. The method includes pre-calculating a library of pupil images for a measuring spot of an object-under-test, wherein each pupil image represents a simulated structure of the object-under-test at the measuring spot given a particular set of configuration values and a particular probing wavelength used for testing the object-under-test using scatterometry. The method further includes in response to receiving a real-time pupil image when testing the object-under-test using scatterometry, comparing the real-time pupil image with the library of pupil images to identify a best match from the library. The method further includes outputting a set of configuration values associated with the best match from the library.

The above-described features can also be provided at least by a system, a computer program product, and a machine, among other types of implementations.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
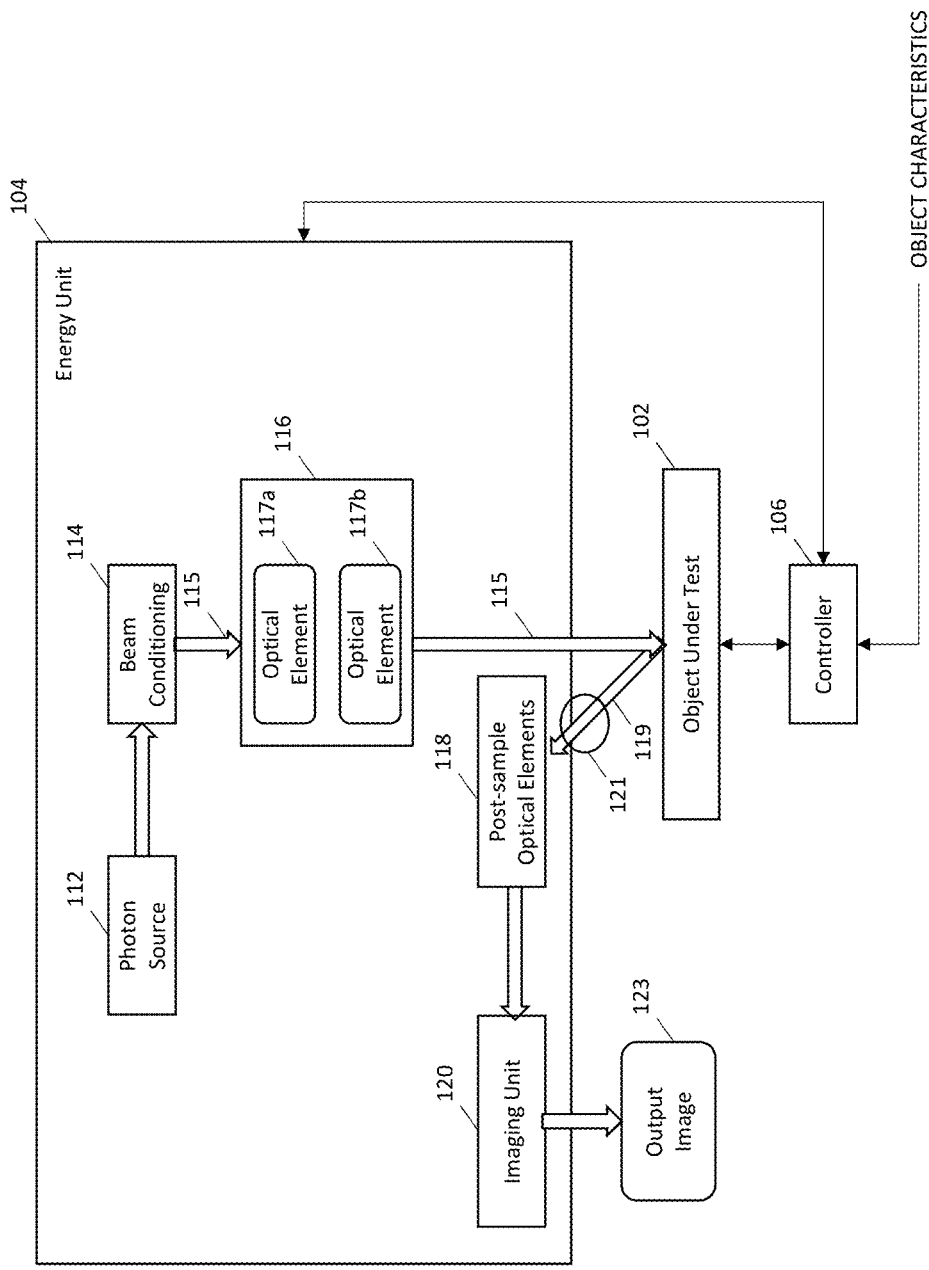
FIG. 1 depicts a block diagram of an overlay metrology system to perform an overlay error analysis on an object-under-test according to one or more embodiments of the present invention.

The diagrams depicted herein are illustrative. There can be many variations to the diagrams, or the operations described therein without departing from the spirit of the invention. For instance, the actions can be performed in a differing order or actions can be added, deleted, or modified. Also, the term "coupled", and variations thereof describe having a communications path between two elements and do not imply a direct connection between the elements with no intervening elements/connections between them. All of these variations are considered a part of the specification.

In the accompanying figures and following detailed description of the disclosed embodiments, the various elements illustrated in the figures are provided with two or three-digit reference numbers. With minor exceptions, the leftmost digit(s) of each reference number corresponds to the figure in which its element is first illustrated.

DETAILED DESCRIPTION

The fabrication of an integrated circuit (IC) requires a variety of physical and chemical processes performed on a semiconductor (e.g., silicon) substrate using a lithographic apparatus, which is a machine that applies a desired pattern onto a substrate, usually onto a target portion of the substrate. In that instance, a patterning device, which is alternatively referred to as a "mask" or a "reticle," can be used to generate a desired circuit pattern to be formed on an individual layer of the IC. This pattern can be transferred onto the target portion (e.g., including part of, one, or several dies) on a substrate (e.g., a silicon wafer). Transfer of the pattern is typically via imaging onto a layer of radiation-sensitive material (e.g., a photoresist) provided on the substrate. However, before the exposure of the photoresist with an image of the mask can begin, this image must be aligned with the previously defined patterns on the wafer. This alignment, and the resulting overlay of the two or more lithographic patterns, is critical because tighter overlay control means circuit features can be packed closer together. Closer packing of devices through better alignment and overlay is nearly as critical as smaller devices through higher resolution in the drive towards more functionality per chip.

In general, a single substrate will contain a network of adjacent target portions that are successively patterned. Known lithographic apparatus include so-called steppers, in which each target portion is irradiated by exposing an entire pattern onto the target portion at one time, and so-called "scanners," in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

To build the complex structures that make up a transistor and the many wires that connect the millions of transistors of a circuit, lithography and etch pattern transfer steps are repeated at multiple times. Each pattern being printed on the wafer is aligned to the previously formed patterns and slowly the conductors, insulators, and selectively doped regions are built up to form the final device. A typical semiconductor device can include twenty to thirty levels of patterned layers. The placement of the patterned features on a given level must match the placement of corresponding features on other levels within an accuracy that is some fraction of the minimum feature size or critical dimension (CD). Generally, as the device features scale downwards and pattern density increases, overlay error budgets also shrink. Because of this, conventional multi-exposure and multi-patterning schemes require very tight overlay error budgets. In conventional lithographic systems, various alignment mechanisms are provided to align features in a given layer to the features in an underlying layer. For advanced nodes, however, optical, or extreme ultraviolet (EUV) scanner improvements alone do not reduce the overlay error enough to meet the required specifications.

In order to monitor the lithographic process, the overlay error between successive layers formed in or on the patterned substrate is measured. This measurement can be performed on a product substrate and/or on a dedicated metrology target, e.g., a golden wafer. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometers are known. Spectroscopic scatterometers direct a broadband radiation beam onto the substrate and measure the spectrum (intensity as a function of wavelength) of the radiation scattered into a particular narrow angular range. Angularly-resolved scatterometers use a monochromatic radiation beam and measure the intensity of the scattered radiation as a function of angle.

The effects of overlay error are typically divided into two major categories for the purpose of quantifying overlay error and making precise exposure adjustments to correct the problem. The first category, referred to as grid or inter-field error, is the positional shift and rotation of each exposure pattern, exposure field, or simple field, with reference to the nominal center position of the wafer. These global or inter-field positional errors can be caused by the wafer stage subsystem of the photolithographic exposure tool. Overlay modeling algorithms typically divide grid or inter-field error into various sub-categories or components the most common of which are translation, rotation, magnification or scale, non-orthogonality, stage distortion and stage rotation. In order to measure and quantify the overlay error that exists between device layers special overlay target patterns can be printed in designed locations across the wafer at each lithographic processing step. If the two patterned layers are perfectly aligned to each other the overlay target patterns will be aligned with each other. Any positional offset or misalignment is a measure of the overlay error.

The second category, intra-field overlay error, is the positional offset of an individual point inside an exposure field referenced to the nominal center of an individual exposure field.

Optical "scatterometry" attempts to evaluate the geometry of a sample based on the pattern of the diffracted light. More specifically, scatterometry systems use a modeling approach to transform scatterometry measurements into geometric measurements. For this type of approach, a theoretical model is defined for each physical structure that will be analyzed. The theoretical model predicts the empirical measurements (scatterometry signals) that scatterometry systems would record for the structure. The theoretical results of this calculation are then compared to the measured data. To the extent the results do not match, the theoretical model is modified, and the theoretical data is calculated once again and compared to the empirical measurements. This process is repeated iteratively until the correspondence between the calculated theoretical data and the empirical measurements reaches an acceptable level of fitness. At this point, the characteristics of the theoretical model and the physical structure should be substantially similar.

Scatterometry takes the diffraction signal from a laser beam with a given spot size. Diffraction is an interaction of light with multiple periods of a structure. The typical assumption is that the features are uniform within the laser spot. This assumption leads to inaccuracies. Furthermore, prior art systems are limited to a specific set of analysis constraints. Broader analysis on a real-time basis is very desirable so that manufacturers can immediately determine when a process is not operating correctly.

Diffraction-based/scatterometry overlay readout depends on several parameters, such as probing wavelength, stack/layer height, grating non-idealities, etc. Additionally, the collected signal during an overlay measurement contains more information than just the overlay misregistration. The technical solutions provided by embodiments of the present invention address the technical challenges associated with detecting misalignments by scatterometry. Embodiments of the present invention improve the misalignment detection and error correction by extracting information from the overlay measurements. Further, one or more embodiments of the present invention use calculated libraries or "look-up tables" to serve at least two purposes: determining quantitative process/films information; and correcting overlay reading based on stack/film/grating process variations.

The improvements provided by embodiments of the present invention are applicable to the process(es) of semiconductor designing, manufacturing, quality control, etc., regardless of the metrology tool that is used, for example, from KLA®, ASML®, ONTO INNOVATION®, NOVA®, etc.

It should be noted that embodiments of the present invention can be applied to overlay metrology using any type of diffraction based overlay error measurement.

In image based overlay metrology, a position of an image of the pattern on the substrate is compared to the position of the mask pattern in the resist layer. From the comparison the overlay error is determined. An example to measure overlay error is the so-called box-in-box structure, in which the position of an inner box within an outer box is measured relative to the position of the outer box.

Figure 4:
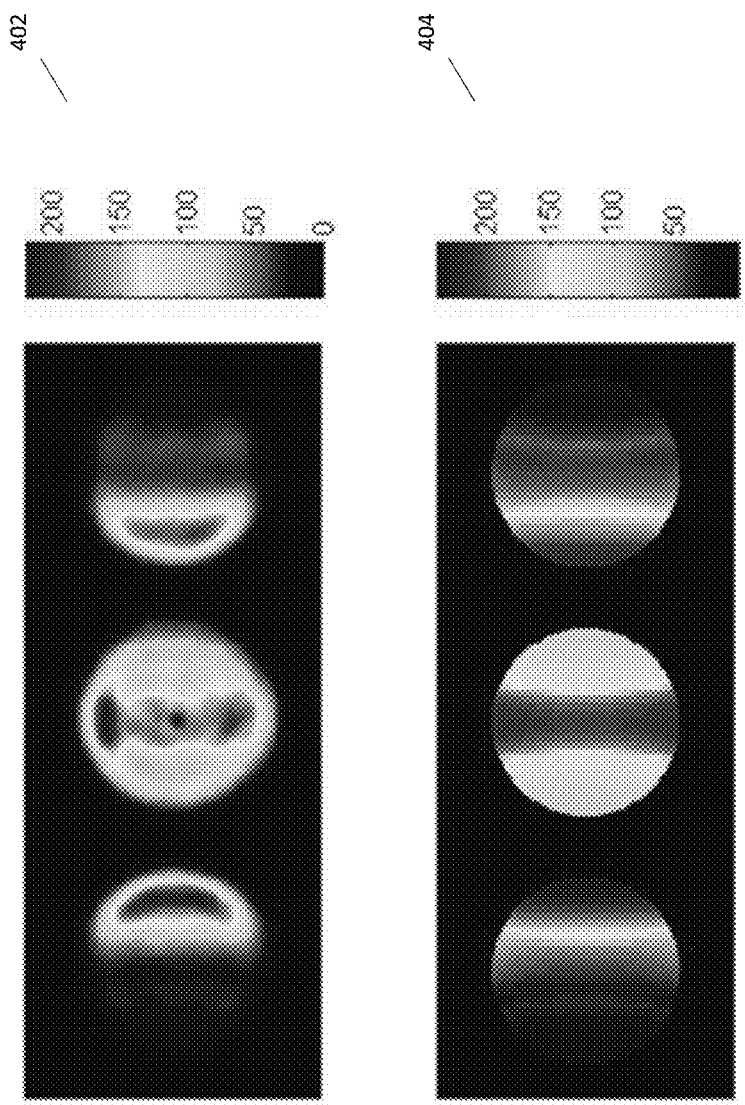
FIG. 4 depicts an example set of pupil images from real signal and simulated signal according to one or more embodiments of the present invention.

In diffraction based overlay metrology, in the pattern layer on the substrate a first grating is located, and in the resist layer a second grating is located with a pitch that is, substantially identical to the first grating. The second grating is located nominally on top of the first grating. By measuring the intensity of the diffraction pattern as generated by the first and second grating superimposed on each other, a measure for the overlay error may be obtained. If some overlay error is present between the first and second grating, this is detectable from the diffraction intensities. The intensity of the 1st and −1st order are compared, and the intensity difference is proportional to the overlay shift. FIG. 4 provides an example of overlay error measurement. As shown, the overlay measurements 402 and 404 always capture +1st and −1st diffraction order and usually also the 0th order. In FIG. 4, view 402 shows overlay measurement of measured signal and view 404 shows simulated signal, both shown $-1^{st}$, $0^{th}$, $+1^{st}$ diffraction orders from left to right. The color bar indicates intensities. In the particular example shown, the target was for pitch=760 nm, top/bottom=330 nm and F=1.

FIG. 1 depicts a block diagram of an overlay metrology system 100 to perform an overlay error analysis on an object-under-test 102 according to one or more embodiments of the present invention. The object-under-test 102 can include a wafer or semiconductor device, for example, including one or more intermediate layers (not shown in FIG. 1). The wafer 102 can include a semiconductor material such as, for example, silicon (Si). The intermediate layers can be composed of various materials including, but not limited to, dielectric materials, semiconductor materials, metal materials, transparent materials, opaque materials, and reflective materials.

The overlay metrology system 100 includes an energy unit 104 that provides the photons that are incident on the object-under-test 102 to detect the overlay error (or offset).

The energy unit 104 includes a photon source 112, a beam conditioning subsystem 114, an optical subsystem 116, a post-optical subsystem 118, and an imaging unit 120.

The photon source 112 generates photons having a wavelength defined by a predetermined wavelength spectrum. For example, the photon source 112 provides EUV wavelength spectrum ranging from approximately 10 nm to approximately 125 nm. Alternatively, or in addition, the photon source generates photons having a wavelength defined by the UV-Vis-NIR wavelength spectrum. The UV wavelength spectrum ranges from approximately 300 nanometers (nm) to approximately 400 nm; the Vis wavelength spectrum ranges from approximately 400 nm to approximately 765 nm; and the NIR wavelength spectrum ranges from approximately 765 nm to approximately 3200 nm. It should be noted, that although only one channel (photon source) is depicted in FIG. 1, in one or more embodiments of the present invention, the overlay metrology system 100 includes a multi-channel energy unit 104, which has multiple photon sources, such as EUV, UV, Vis, NIR, or any other types of photon source with different wavelengths.

The beam conditioning subsystem 114 includes, for example, an optical resonator that boosts the photons from the energy source 112 into a higher-energy EUV beam 115. Beam conditioning is performed through careful alignment and allowing light to travel through series of optical elements like polarizers, compensators, and mirrors. Characteristics of optical elements are optimized based on the incoming wavelength and laser source. Polarizers are used to induce directionality to source radiation, while compensators are utilized to alter phase as needed for overlay measurement. Mirrors and lenses are additional components used to focus the light beam precisely on to the target structure on the sample and direct the diffracted signal to detector.

The optical system 116 includes one or more optical elements 117a, 117b. The optical elements 117a, 117b can include mirrors, for example, which further focus the beam 115 before delivering it, via an energy channel, to the object-under-test 102. Mirrors are also configured to increase the cumulative intensity of incoming radiation. In this manner, the focused beam 115 can be scanned across the object-under-test 102 and/or focused on one or more targeted areas of the object-under-test 102.

The post-optical subsystem 118 receives reflected energy 119 (e.g., reflected photons) detected by one or more sensors 121, and performs one or more signal analysis operations on the reflected energy 119. In one more embodiments of the invention, diffracted or reflected optical signal passes through series of compensators (not shown), an analyzer unit or analyzer controller (not shown), and finally reach a solid state detector (not shown). The analyzer is used to identify and extract necessary characteristics (phase, polarization, intensity) of the diffracted signal. Solid state detectors are fast, efficient and convert the light signal to digital signal for further data analysis.

The imaging unit 120 is in signal communication with the post-optical subsystem 118. The imaging unit 120 can be constructed as a charge-coupled device (CCD) camera, for example, which can generate an image 123 of the object-under-test 102 based on the sampled signal output from the post-optical subsystem 118. The image 123 not only shows the exterior profile and surface structures of the object-under-test 102, but also shows the profile of buried structures embedded in the object-under-test 102. In this manner, an overlay error analysis of the surface structures and buried structures can be performed as described in greater detail below.

The energy unit 104 is in signal communication with an electronic hardware controller 106. In one or more embodiments of the invention, the controller 106 receives data characteristics associated with the object-under-test 102. In one or more embodiments of the invention, the characteristics are associated with the structural characteristics of a semiconductor device, for example. The characteristics include, but are not limited to, whether the object-under-test 102 includes one or more intermediate layers, the material composition of the layers, and the thickness of the layers. The data can also indicate whether the material composition of the intermediate layers includes a non-photon blocking characteristic or a photon blocking characteristic. The non-photon blocking characteristics include, for example, a transparent layer, a layer composed of a dielectric material, and/or a layer that is less than or equal to a thickness threshold. The photon blocking characteristics include, for example, an opaque layer, a reflective layer, a layer composed of a metal material, and/or a layer that exceeds a thickness threshold.

Figure 2:
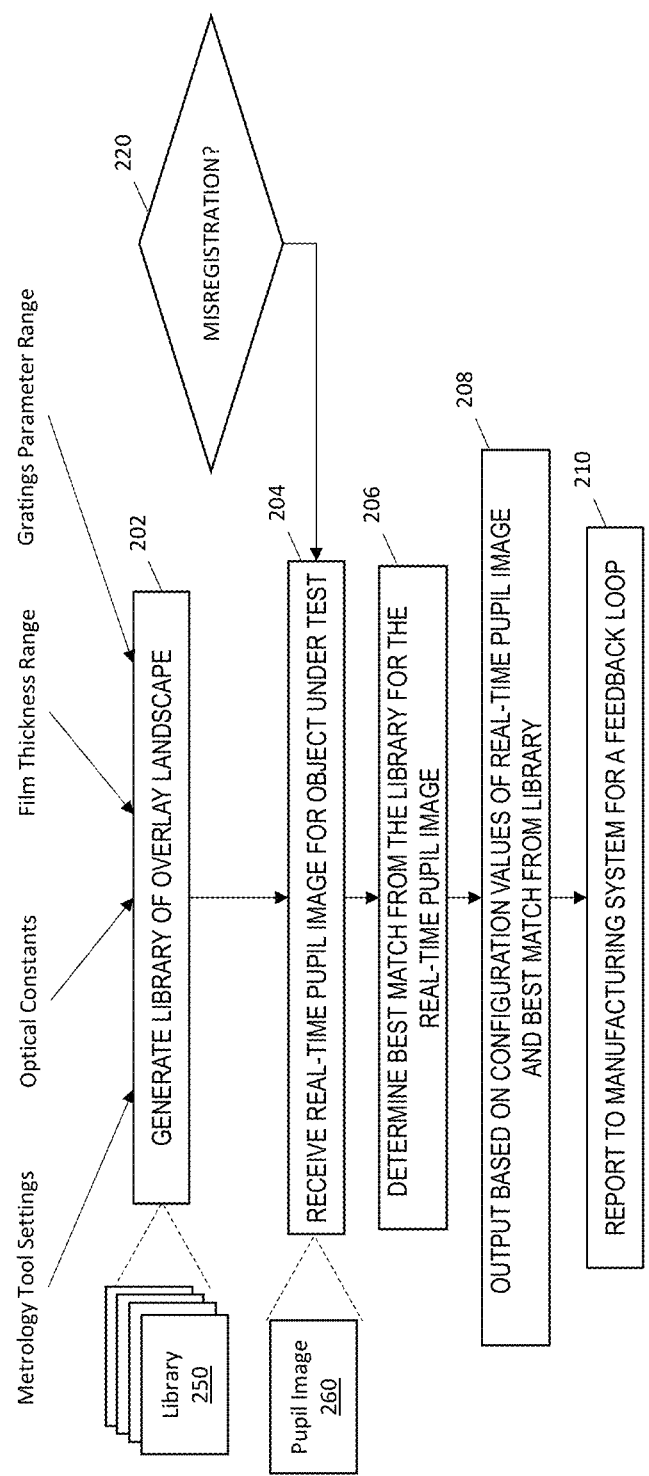
FIG. 2 depicts a flowchart of a method to obtain quantitative process information during an overlay measurement according to one or more embodiments of the present invention.

FIG. 2 depicts a flowchart of a computer-implemented method 200 to obtain quantitative process information during an overlay measurement according to one or more embodiments of the present invention.

The method 200 includes generating libraries 250 of pupil images for a particular object-under-test 102, at block 202. Each library 250 is a lookup table containing pupil images for a range of scenarios. Here, a "scenario" is a particular set of configuration values used to generate the object-under-test 102. The configuration values can include, but are not limited to, tool setting information (wavelength ranges, polarization conditions, etc.), optical constants for the films (n & k; n=refractive index, k=extinction coefficient; usually determined with ellipsometry on a blanket film), film thickness ranges, parameter ranges of both prior and current gratings such as CD (critical dimension), (asymmetric) SWA (side wall angle), height, etc. The configuration values can be selected based on the object characteristics that are provided to the controller 102. It should be noted that in one or more embodiments of the present invention, the libraries 250 are created by the controller 102 that is associated with the optical metrology system 100. Alternatively, or in addition, the libraries 250 are created by another controller (i.e., computing system) that is different from the controller 102. The other controller can generate the libraries 250 in an offline manner and provide the libraries 250 to the controller 102 prior to performing the metrology operations.

Figure 3:
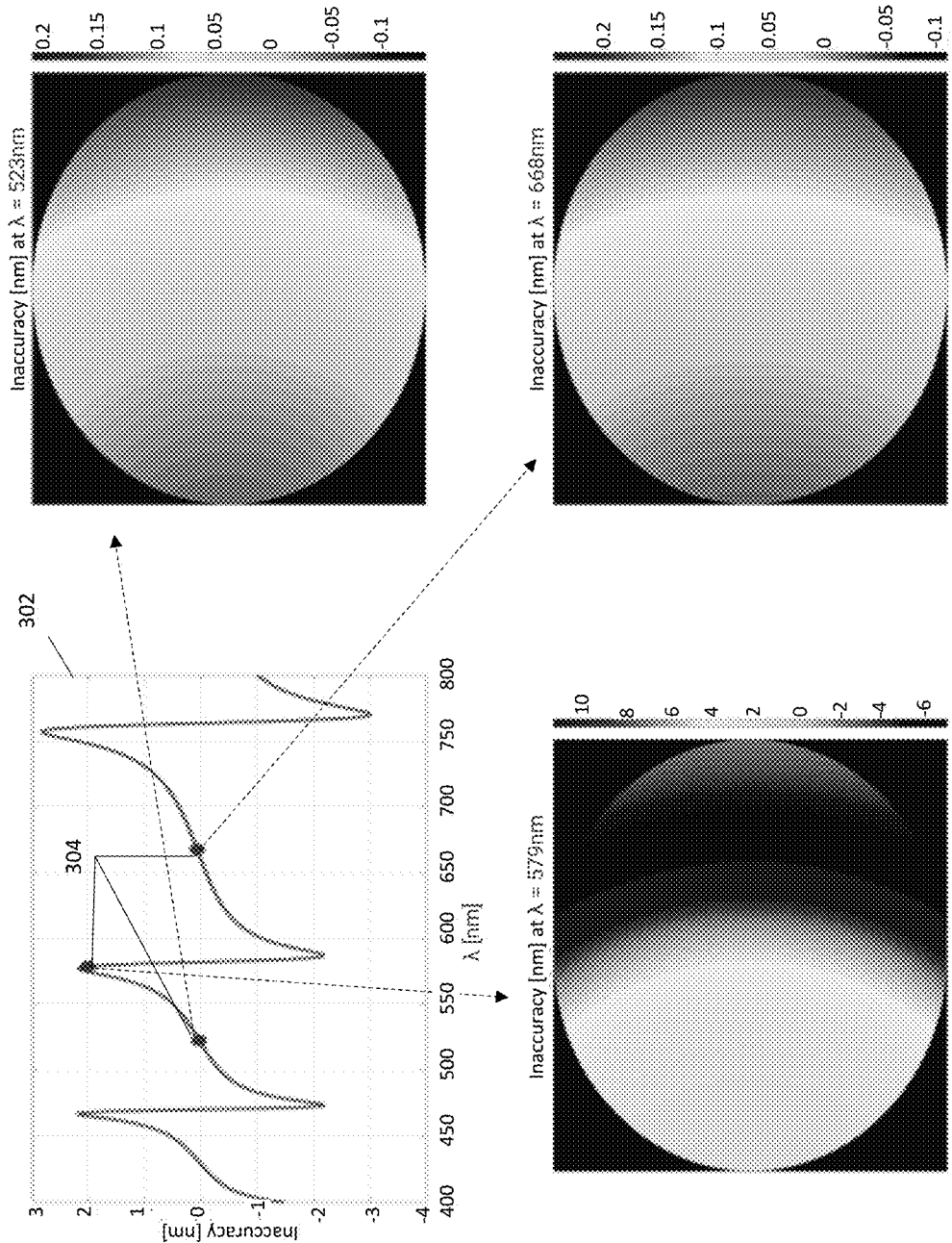
FIG. 3 depicts an example simulated data for an object-under-test according to one or more embodiments of the present invention.

FIG. 3 depicts an example simulated data for an object-under-test according to one or more embodiments of the present invention. For a set of configuration values that are input, inaccuracies are simulated for multiple probing wavelengths ($\lambda$) of the beam 115. Each point in the plot 302 can represent a pupil image 304. The pupil image 304 provides the intensity of the inaccuracies at the point (inaccuracy, wavelength) based on one or more quantified attributes.

The pupil images 304 can be used to determine set of quantified attributes for a specific measurement position. A measurement position (or spot) is a position on the object-under-test 102 at which the beam 115 is incident and measurements are captured using scatterometry. The measurement position can be a cell of the object-under-test 102. For the input set of configuration values, different types of measurements are simulated at each measurement position of the object-under-test. The simulated measurements can include sensitivity, reflectivity, pupil 3S, etc. Here, the sensitivity can represent the thickness of the film at the measurement position. The pupil 3S can represent the reliability of the simulated data being used for the generating the pupil image 304. Reflectivity is the relative intensity variation across the object under test 102.

The pupil image 304 is specific to the particular measurement position, for a given probing wavelength (2), and the selected configuration values.

Referring to FIG. 3, at each point on the plot 302, a set of pupil images (0th order, −1st order, +1st order) is simulated for each measuring position of the object-under-test 102. The pupil images 304 are specific to a certain measurement configuration as described herein, such as n&k, thickness, etc. Accordingly, the quantified attributes are determined (i.e., simulated) at each potential overlay site resulting in a detailed process map to be used during the metrology operation.

The larger the number of probing wavelengths ($\lambda$) used, larger is the number of simulated the pupil images 304, and in turn, more accurate and complete the simulated data. The data analysis (described elsewhere) is more accurate with more spectral information. Hence, data acquired at multiple wavelengths leads to a more accurate error detection. Multiple wavelengths also help with parameter correlations and lead to a unique answer. For example, if one wavelength is measured, there may be multiple sets of parameters (e.g., multiple combinations of film thicknesses and SWA) that lead to that same pupil image. In some aspects, if two or more wavelengths are measured there is only one combination matching the scenario of multiple pupil images.

Thus, a library 250, which is a multi-dimensional lookup-table, is generated for each set of configuration values. The library 250 includes multiple simulated pupil images 304 corresponding to each point on the plot 302, a point representing predicted inaccuracy at a particular probing wavelength ($\lambda$). The library 250, accordingly, represents how a pupil image 304 should like at a certain wavelength and certain configuration values. For example, FIG. 3 represents a desired pupil image 304 at wavelength 579 nanometers with a certain set of configuration values.

In one or more embodiments of the present invention, the library 250 may not contain "exact" values but can also be used in conjunction with an interpolation algorithm. For example, consider that one layer can vary between 90 and 110 nm. The library 250 in this case may contain the solutions for pupil images between 90 and 110 in steps of 2 nm (calculation speed). Based on interpolation, one or more embodiments of the present invention can then narrow down that the solution lies between 96 and 98 nm. Interpolation between these two values can then lead to the exact determination of 97.12 nm, for example. Accordingly, the calculations for precomputing the library 250 can be optimized for speed and accuracy. Other optimizations can be used to reduce the computer resources required to pre-compute the library 250.

The dimensions of the multi-dimensional lookup-table (i.e., library) can be selected by an operator/user of the metrology system 100. The dimensions are the configuration values and corresponding ranges that can be varied during manufacture of the object-under-test 102.

In one or more embodiments of the present invention, the libraries 250, based on the selections by the operator, are computed for each combination of the selected ranges. However, in some embodiments of the present invention, such a combination can result in large amounts (multiple gigabytes, terabytes, etc.) of data to be computed, which can require large amounts of time (days, weeks, months, etc.) and computing resources. Accordingly, in one or more embodiments of the present invention, the data is simulated only for particular wavelengths to improve the data simulation process. For example, only every 5th wavelength, or every 10th wavelength, or predetermined list of wavelengths from the operator, or any other such set of wavelengths can be selected to simulate the pupil image data.

Alternatively, or in addition, other parameters can be reduced to reduce the time and data for the simulation. For example, for each wavelength, only the film thickness is simulated at each point to generate the pupil image 304. Further, as described above, in some embodiments of the present invention, interpolation can be used to reduce the number of calculations required during the pre-calculations.

Referring to the flowchart of method 200 (FIG. 2), the method 200 further includes receiving scatterometry data for a measuring position of the object-under-test 102, at block 204. The scatterometry data includes the data obtained by the overlay metrology system 100. The data that is obtained is (or can be converted into) a real-time pupil image 260. In one or more embodiments of the present invention, the scatterometry data for the real-time pupil image 260 is received in response to a misregistration being detected in the object-under-test 102, at block 220. The misregistration can be detected using any known techniques or that are later developed. The improvements provided herein are applicable irrespective of how the misregistration is detected.

The real-time pupil image 260 is compared with the pupil images 304 in the libraries 250 to determine a best match, at block 206. The best match can be determined using any image comparison or data comparison technique that is known or developed later. In one or more embodiments of the present invention, the probing wavelength being used by the overlay metrology system 100 is known, and accordingly, determining the best match can be limited to a search for the library associated with that wavelength.

The best match parameter combination, i.e., the configuration values, for the measuring spot associated with the best match pupil image 304 from the library 250 is determined. The configuration values for the best match are output, in one or more embodiments of the present invention, at block 208. Alternatively, or in addition, a difference in the configuration values of the pupil image 304 from the library 250 and the configuration values of the real-time pupil image 260 can be determined and output, at block 208.

The output can facilitate correcting the misregistration output based on the determination of the configuration values. At the very least a pupil filter (region of interest) can be determined that would most accurately describe the misregistration.

In one or more embodiments of the present invention, at block 210, the difference values are reported to the manufacturing/design system (not shown). The manufacturing system adjusts one or more parameters to reduce the difference in the configuration values. A feedback loop can be created in this manner.

The method 200 facilitates obtaining more accurate misregistration information after application of a metrology data correction algorithm compared to existing techniques. The method 200 facilitates use of a library-based evaluation of the pupil image for a quantitative analysis, and not just a qualitative analysis.

Embodiments of the present invention facilitate obtaining quantitative process information during an overlay measurement. Embodiments of the present invention also facilitate obtaining more accurate misregistration information after application of a metrology data correction algorithm. In one or more embodiments of the present invention, optical libraries are precalculated and utilized to analyze the acquired data during a metrology step intended to determine overlay misregistration. Such data analysis yields process information across the object-under-test at much higher sampling than is typically used at a films or OCD measurement step. Process information such a film thickness, grating CD, grating SWA may be obtained using embodiments of the present invention. The use of pre-calculated libraries ensures that the calculation efforts at the time of data collection is minimized and analysis can be done on the fly without an impact on manufacturing time. Some or all of the obtained process information can be used to correct the overlay misregistration reading to yield a more accurate reading.

Embodiments of the present invention, accordingly, improve a semiconductor manufacturing process, such as lithography. Embodiments of the present invention provide a practical application to a technical challenge in the manufacturing process of identifying a misregistration, particularly determining an overlay error in an object-under-test, accurately, and further to correct the misregistration.

Figure 5:
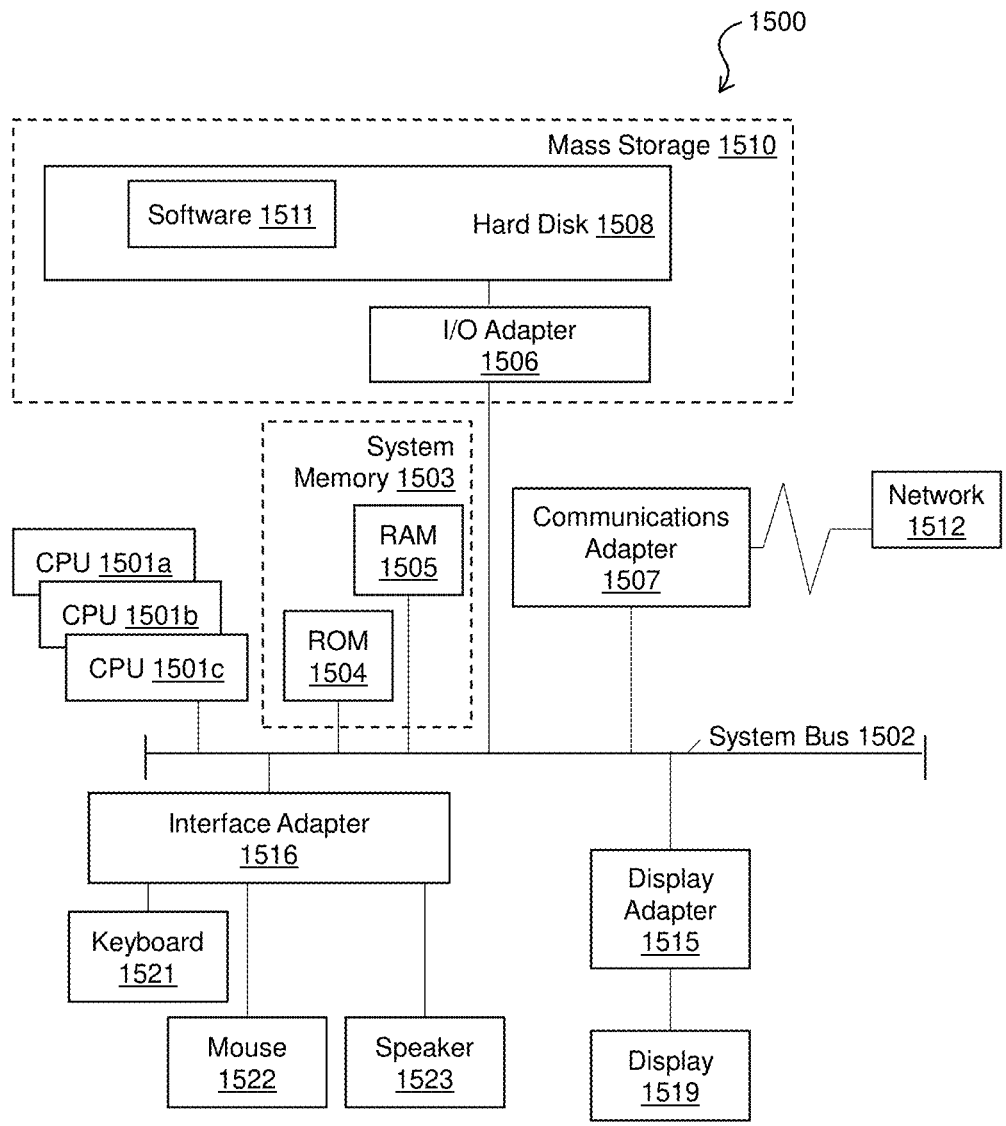
FIG. 5 depicts a computing system according to one or more embodiments of the present invention.

FIG. 5 depicts a computing system according to one or more embodiments of the present invention. Turning now to FIG. 5, a computer system 1500 is generally shown in accordance with an embodiment. The computer system 1500 can be a computing system being used as the controller 104 and/or the computing system used to pre-calculate the libraries 250 and/or to implement the method 200. The computer system 1500 can be an electronic, computer framework comprising and/or employing any number and combination of computing devices and networks utilizing various communication technologies, as described herein. The computer system 1500 can be easily scalable, extensible, and modular, with the ability to change to different services or reconfigure some features independently of others. The computer system 1500 may be, for example, a server, desktop computer, laptop computer, tablet computer, or smartphone. In some examples, computer system 1500 may be a cloud computing node. Computer system 1500 may be described in the general context of computer system executable instructions, such as program modules, being executed by a computer system. Generally, program modules may include routines, programs, objects, components, logic, data structures, and so on that perform particular tasks or implement particular abstract data types. Computer system 1500 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 5, the computer system 1500 has one or more central processing units (CPU(s)) 1501a, 1501b, 1501c, etc. (collectively or generically referred to as processor(s) 1501). The processors 1501 can be a single-core processor, multi-core processor, computing cluster, or any number of other configurations. The processors 1501, also referred to as processing circuits, are coupled via a system bus 1502 to a system memory 1503 and various other components. The system memory 1503 can include a read only memory (ROM) 1504 and a random access memory (RAM) 1505. The ROM 1504 is coupled to the system bus 1502 and may include a basic input/output system (BIOS), which controls certain basic functions of the computer system 1500. The RAM is read-write memory coupled to the system bus 1502 for use by the processors 1501. The system memory 1503 provides temporary memory space for operations of said instructions during operation. The system memory 1503 can include random access memory (RAM), read only memory, flash memory, or any other suitable memory systems.

The computer system 1500 comprises an input/output (I/O) adapter 1506 and a communications adapter 1507 coupled to the system bus 1502. The I/O adapter 1506 may be a small computer system interface (SCSI) adapter that communicates with a hard disk 1508 and/or any other similar component. The I/O adapter 1506 and the hard disk 1508 are collectively referred to herein as a mass storage 1510.

Software 1511 for execution on the computer system 1500 may be stored in the mass storage 1510. The mass storage 1510 is an example of a tangible storage medium readable by the processors 1501, where the software 1511 is stored as instructions for execution by the processors 1501 to cause the computer system 1500 to operate, such as is described herein below with respect to the various Figures. Examples of computer program product and the execution of such instruction is discussed herein in more detail. The communications adapter 1507 interconnects the system bus 1502 with a network 1512, which may be an outside network, enabling the computer system 1500 to communicate with other such systems. In one embodiment, a portion of the system memory 1503 and the mass storage 1510 collectively store an operating system, which may be any appropriate operating system, such as the z/OS or AIX operating system from IBM Corporation, to coordinate the functions of the various components shown in FIG. 5.

Additional input/output devices are shown as connected to the system bus 1502 via a display adapter 1515 and an interface adapter 1516 and. In one embodiment, the adapters 1506, 1507, 1515, and 1516 may be connected to one or more I/O buses that are connected to the system bus 1502 via an intermediate bus bridge (not shown). A display 1519 (e.g., a screen or a display monitor) is connected to the system bus 1502 by a display adapter 1515, which may include a graphics controller to improve the performance of graphics intensive applications and a video controller. A keyboard 1521, a mouse 1522, a speaker 1523, etc. can be interconnected to the system bus 1502 via the interface adapter 1516, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 5, the computer system 1500 includes processing capability in the form of the processors 1501, and storage capability including the system memory 1503 and the mass storage 1510, input means such as the keyboard 1521 and the mouse 1522, and output capability including the speaker 1523 and the display 1519.

In some embodiments, the communications adapter 1507 can transmit data using any suitable interface or protocol, such as the internet small computer system interface, among others. The network 1512 may be a cellular network, a radio network, a wide area network (WAN), a local area network (LAN), or the Internet, among others. An external computing device may connect to the computer system 1500 through the network 1512. In some examples, an external computing device may be an external webserver or a cloud computing node.

It is to be understood that the block diagram of FIG. 5 is not intended to indicate that the computer system 1500 is to include all of the components shown in FIG. 5. Rather, the computer system 1500 can include any appropriate fewer or additional components not illustrated in FIG. 5 (e.g., additional memory components, embedded controllers, modules, additional network interfaces, etc.). Further, the embodiments described herein with respect to computer system 1500 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Embodiments of the present invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc. Before describing such embodiments in more detail, however, it is instructive to present example environments in which embodiments of the present invention can be implemented.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, an article or apparatus that includes a list of elements is not necessarily limited to only those elements but can include other elements not expressly listed or inherent to such article or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

It should be noted that not all masking, patterning, and lithography processes are shown, because a person of ordinary skill in the art would recognize where masking and patterning processes are utilized to form the identified layers and openings, and to perform the identified selective etching processes, as described herein.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The present invention may be a system, a method, and/or a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the Figures. For example, two blocks shown in succession may, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method of using a control module to control a lithographic apparatus, the computer-implemented method comprising:
   pre-calculating, using a processor, a library of pupil images for a measuring spot of an object-under-test, wherein each pupil image represents a simulated structure of the object-under-test at the measuring spot given a particular set of configuration values and a particular probing wavelength used for testing the object-under-test using scatterometry;
   in response to receiving a real-time pupil image when testing the object-under-test using scatterometry, comparing, using the processor, the real-time pupil image with the library of pupil images to identify a best match from the library; and
   outputting a set of configuration values associated with the best match from the library.

2. The computer-implemented method of claim 1, wherein the real-time pupil image is received in response to a misregistration being detected in the object-under-test.

3. The computer-implemented method of claim 2, wherein the misregistration represents an overlay error in the object-under-test.

4. The computer-implemented method of claim 1, wherein the set of configuration values comprises object characteristics of the object-under-test.

5. The computer-implemented method of claim 1, wherein the set of configuration values comprises one or more settings of an overlay metrology system being used to perform the scatterometry.

6. The computer-implemented method of claim 1, wherein the library is pre-calculated for a predetermined set of probing wavelengths.

7. The computer-implemented method of claim 1, wherein the library is pre-calculated for a predetermined set of configuration values.

8. A computer program product comprising a machine-readable medium that has computer executable instructions stored thereon, the computer executable instructions when executed by one or more processing units cause the one or more processing units to perform a method comprising:
   pre-calculating a library of pupil images for a measuring spot of an object-under-test, wherein each pupil image represents a simulated structure of the object-under-test at the measuring spot given a particular set of configuration values and a particular probing wavelength used for testing the object-under-test using scatterometry;
   in response to receiving a real-time pupil image when testing the object-under-test using scatterometry, comparing the real-time pupil image with the library of pupil images to identify a best match from the library; and
   outputting a set of configuration values associated with the best match from the library.

9. The computer program product of claim 8, wherein the real-time pupil image is received in response to a misregistration being detected in the object-under-test.

10. The computer program product of claim 9, wherein the misregistration represents an overlay error in the object-under-test.

11. The computer program product of claim 8, wherein the set of configuration values comprises object characteristics of the object-under-test.

12. The computer program product of claim 8, wherein the set of configuration values comprises one or more settings of an overlay metrology system being used to perform the scatterometry.

13. The computer program product of claim 8, wherein the library is pre-calculated for a predetermined set of probing wavelengths.

14. The computer program product of claim 8, wherein the library is pre-calculated for a predetermined set of configuration values.

15. A system for enhanced overlay control, the system comprising:
   an energy unit; and
   a controller coupled with the energy unit, the controller configured to test an object-under-test by performing a method comprising:
      pre-calculating a library of pupil images for a measuring spot of an object-under-test, wherein each pupil image represents a simulated structure of the object-under-test at the measuring spot given a particular set of configuration values and a particular probing wavelength used for testing the object-under-test using scatterometry;
      in response to receiving a real-time pupil image when testing the object-under-test using scatterometry, comparing the real-time pupil image with the library of pupil images to identify a best match from the library; and
      outputting a set of configuration values associated with the best match from the library.

16. The system of claim 8, wherein the real-time pupil image is received in response to a misregistration being detected in the object-under-test.

17. The system of claim 16, wherein the misregistration represents an overlay error in the object-under-test.

18. The system of claim 15, wherein the set of configuration values comprises object characteristics of the object-under-test.

19. The system of claim 15, wherein the set of configuration values comprises one or more settings of an overlay metrology system being used to perform the scatterometry.

20. The system of claim 15, wherein the library is pre-calculated for a predetermined set of probing wavelengths.

* * * * *